United States Patent
Lee

(10) Patent No.: US 7,074,461 B2
(45) Date of Patent: Jul. 11, 2006

(54) METHOD FOR FABRICATING HYDROGENATED SILICON OXYCARBIDE THIN FILM

(75) Inventor: Young Suk Lee, Sungnam (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/890,586

(22) Filed: Jul. 13, 2004

(65) Prior Publication Data

US 2004/0247799 A1 Dec. 9, 2004

Related U.S. Application Data

(62) Division of application No. 10/227,785, filed on Aug. 26, 2002, now Pat. No. 6,772,710.

(30) Foreign Application Priority Data

Sep. 1, 2001 (KR) ................................ 53721/2001

(51) Int. Cl.
*H05H 1/24* (2006.01)

(52) U.S. Cl. ...................................... 427/577; 427/578

(58) Field of Classification Search ................. 427/577, 427/578
See application file for complete search history.

(56) References Cited

U.S. PATENT DOCUMENTS

| | | | |
|---|---|---|---|
| 6,410,462 B1 * | 6/2002 | Yang et al. | 438/788 |
| 6,576,980 B1 * | 6/2003 | Shao et al. | 257/632 |
| 6,593,248 B1 * | 7/2003 | Loboda et al. | 438/758 |
| 6,784,119 B1 * | 8/2004 | Gaillard et al. | 438/780 |

FOREIGN PATENT DOCUMENTS

KR     2003-0112227     2/2003

OTHER PUBLICATIONS

Untranslated Korean Office Action dated Jun. 30, 2003 corresponding to Korean application No. 10-2001-0053721, no page numbers.

English translation of Abstract for Korean patent application No. 2003-0112227 dated Feb. 12, 2003, no page numbers.

* cited by examiner

*Primary Examiner*—Bret Chen
(74) *Attorney, Agent, or Firm*—Ostrolenk, Faber, Gerb & Soffen, LLP

(57) ABSTRACT

A hydrogenated SiOC thin film fabrication method includes supplying bis-trimethylsilylmethane and oxygen retaining gas to a wafer installed inside a reaction channel through one supply pipe, simultaneously or sequentially supplying hydrogen to the wafer through another supply pipe, applying RF power in the range of 100 W~2000 W while supplying those gases and generating a plasma of those gases. During a post process such as oxygen ashing, carbon loss of SiOC film is minimized due to the supplied hydrogen.

5 Claims, 6 Drawing Sheets

METHOD FOR FABRICATING HYDROGENATED SILICON OXYCARBIDE THIN FILM

CROSS-REFERENCE TO RELATED APPLICATIONS

The present application is a divisional under 37 C.F.R. §1.53(b) of prior application U.S. patent application Ser. No. 10/227,785, filed Aug. 26, 2002, now U.S. Pat. No. 6,772,710 issued Aug. 10, 2004, by Young Suk LEE entitled "PLASMA ENHANCED CHEMICAL VAPOR DEPOSITION APPARATUS," the contents of which are incorporated herein by reference.

BACKGROUND OF THE INVENTION

1. Field of the Invention

The present invention relates to a method for fabricating a hydrogenated silicon oxycarbide (H:SiOC) thin film, and in particular to a method for fabricating a hydrogenated SiOC thin film having low dielectric permitivity, which is capable of minimizing carbon loss although a thin film passes a following process such as an oxygen ashing, etc.

2. Description of the Prior Art

With the intergration of semiconductor device, because finer circuit structure is required, a horizontal interval between metal wiring formed on the same plane has to be reduced. However, when an interval of metal wiring is reduced, cross talk may occur between the metal wiring by a parasitic capacitance between them. In that case, an electric signal transmission through the metal wiring may not be performed well or transmission speed may be lowered. In order to improve a speed of signal transmission through the metal wiring, the parasitic capacitance between the metal wiring has to be low. Accordingly, insulating layers having low dielectric permitivity are required.

One of the insulating layers, a SiOC (silicon oxycarbide) thin film fabricated by retaining lots of carbon in the conventional $SiO_2$ thin film comes to the front. The SiOC thin film can be formed by a CVD (chemical vapor deposition), herein, methylsilance, di-methylsilane, tri-methylsilane and tetra-methylsilane, etc. can be used in the CVD.

In the SiOC thin film, carbon retained in the thin film as $CH_n$ shape dangles about part of $SiO_2$ having a mesh structure, and air hole having a nanometer size is formed by the dangling, herein, the air hole affects dielectric permitivity lowering. In addition, it is assumed that $Si—CH_3$ bonding has smaller ionic polarizability than that of $Si—O$ bonding, however, its mechanism has not been clarified accurately.

However, in the SiOC thin film, because an ashing process using oxygen is performed to eliminate a sensitizing solution hardened by a dry etching, a wet etching or an ionic injection, etc. and carbon loss in the thin film occurs by an additional following process, thin film characteristics may be lowered.

SUMMARY OF THE INVENTION

In order to solve the above-mentioned problems, it is an object of the present invention to provide a method for fabricating a hydrogenated SiOC (silicon oxycarbide) thin film which is capable of minimizing carbon loss although a thin film passes a following process such as an oxygen ashing.

In addition, it is another object of the present invention to provide a PECVD (plasma enhanced chemical vapor deposition) apparatus used in fabrication of the above-mentioned SiOC thin film.

A hydrogenated SiOC thin film fabrication method includes supplying BTMSM (bis-trimethylsilylmethane) and oxygen retaining gas to a wafer installed inside a reaction channel through one supply pipe, simultaneously or sequentially supplying hydrogen to the wafer through another supply pipe, applying RF power in the range of 100~2000 W while supplying those gases and generating plasma of those gases.

In the meantime, a PECVD (plasma enhanced chemical vapor deposition) apparatus in accordance with the present invention includes a reaction chamber; plural susceptors installed inside the reaction chamber and horizontally mounted with a wafer respectively; a heating means for heating the susceptors; a power supply unit installed outside of the reaction chamber; a plasma electrode receiving RF power from the power supply unit, generating and maintaining plasma inside the reaction chamber; and a rotation jet spray having two spray injectors horizontally rotating and supplying gas inside the reaction chamber.

The rotation jet spray includes a cylinder vertically combined with the upper wall of the reaction chamber, having two ring-shaped grooves formed along the inner circumference and respectively connected to two gas injection holes penetrating the side wall of the ring-shaped groove; a rotational shaft vertically disposed inside the reaction chamber by being inserted into the cylinder to perform a rotation motion in a state adhered closely to the internal wall of the cylinder and having two gas supply pipes parallel to the length direction and connected to the ring-shaped grooves; and tube-shaped two spray injectors horizontally installed so as to be respectively connected to the gas supply pipes at the insertion end of the rotational shaft to perform a horizontal rotation by the rotation of the rotational shaft and having plural injection holes at the lower portion.

It is preferable for the two spray injectors to face each other centering around the center of the rotational shaft.

Oxygen can be used as the oxygen retaining gas, and it is preferable to deposit a thin film by rotating the spray injector at the speed of 1~100 rpm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a perspective sectional view illustrating a PECVD apparatus;

FIG. 2 illustrates a wafer mounted onto a susceptor;

FIG. 3 is a transverse sectional view illustrating a rotation jet spray;

FIG. 4 is a transverse sectional view illustrating a cylinder of the rotation jet spray;

FIG. 5 illustrates a rotational shaft;

DETAILED DESCRIPTION OF THE PREFERRED EMBODIMENT

Hereinafter, the embodiment of the present invention will be described with reference to accompanying drawings.

FIGS. 1~5 illustrate a PECVD (plasma enhanced chemical vapor deposition) apparatus used for fabrication of a hydrogenated SiOC (silicon oxycarbide) thin film in accordance with the present invention. Herein, FIGS. 3~illustrate a rotation jet spray of the apparatus in more detail.

Figure 1:
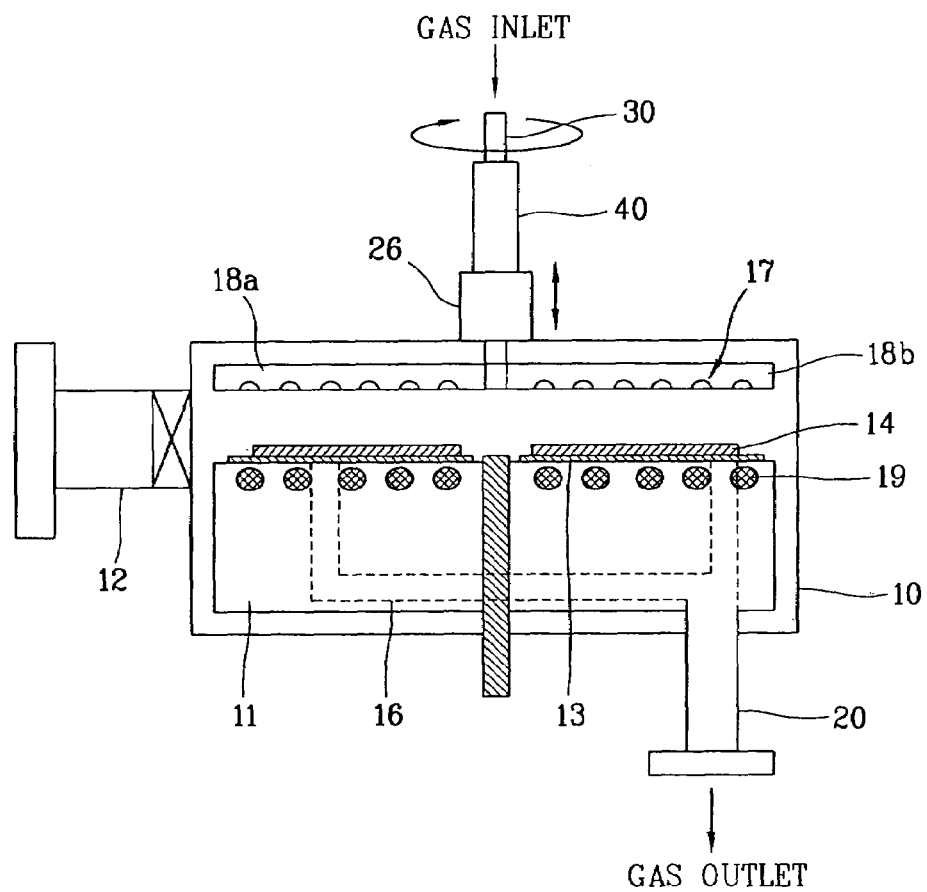
FIGS. 1~5 illustrate a PECVD (plasma enhanced chemical vapor deposition) apparatus used for fabrication of a hydrogenated SiOC (silicon oxycarbide) thin film in accordance with the present invention.

As depicted in FIG. 1, in a reaction chamber 10, a gas discharge hole 20 for discharging gas is disposed, and a susceptor supporting unit 11 is horizontally disposed. Plural susceptors 13 are mounted onto the susceptor supporting unit 11, and a wafer 14 is mounted onto each susceptor.

Figure 2:
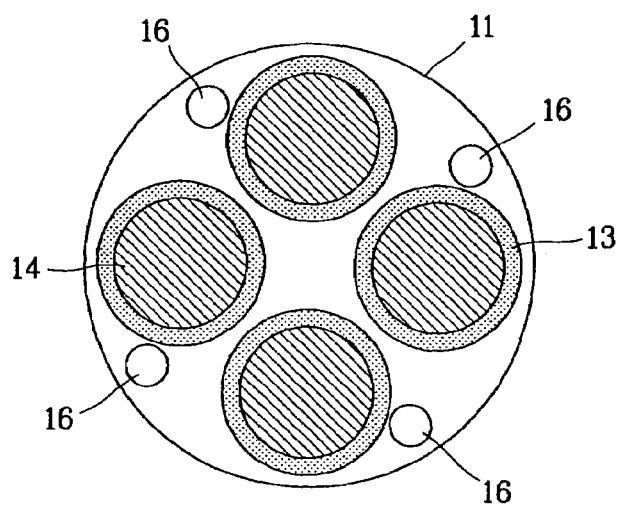

As depicted in FIG. 2, the plural susceptors 13 are mounted onto the susceptor supporting unit 11, and the wafer 14 is mounted onto each susceptor. The susceptor supporting unit 11 has at least one through hole 16 connected to the gas discharge hole 20. A cylinder 40, a rotational shaft 30 and a rotation jet spray consisting of spray injectors 18a, 18b are disposed in the upper portion of a reaction chamber 10.

In the operation of the apparatus, while the spray injectors 18a, 18b are rotated, gas is injected onto the wafer 14 inside the reaction chamber 10. According to circumstances, instead of the spray injectors 18a, 18b, the susceptor supporting unit 11 can be installed to perform a horizontal rotation. In addition, according to processes there is a need to adjust a distance between the sparay injectors 18a, 18b and the susceptor 13, and the susceptor supporting unit 11 and the rotational shaft 30 are installed so as to move up and down respectively.

Unexplained reference numeral 12 is a wafer loading unit, 19 is a heater having a concentric circle structure disposed in the susceptor supporting unit 11. A plasma electrode (not shown) is installed at the upper portion of the reaction chamber 10 to generate and maintain plasma inside the reaction chamber 10 by receiving RF power.

Figure 3:
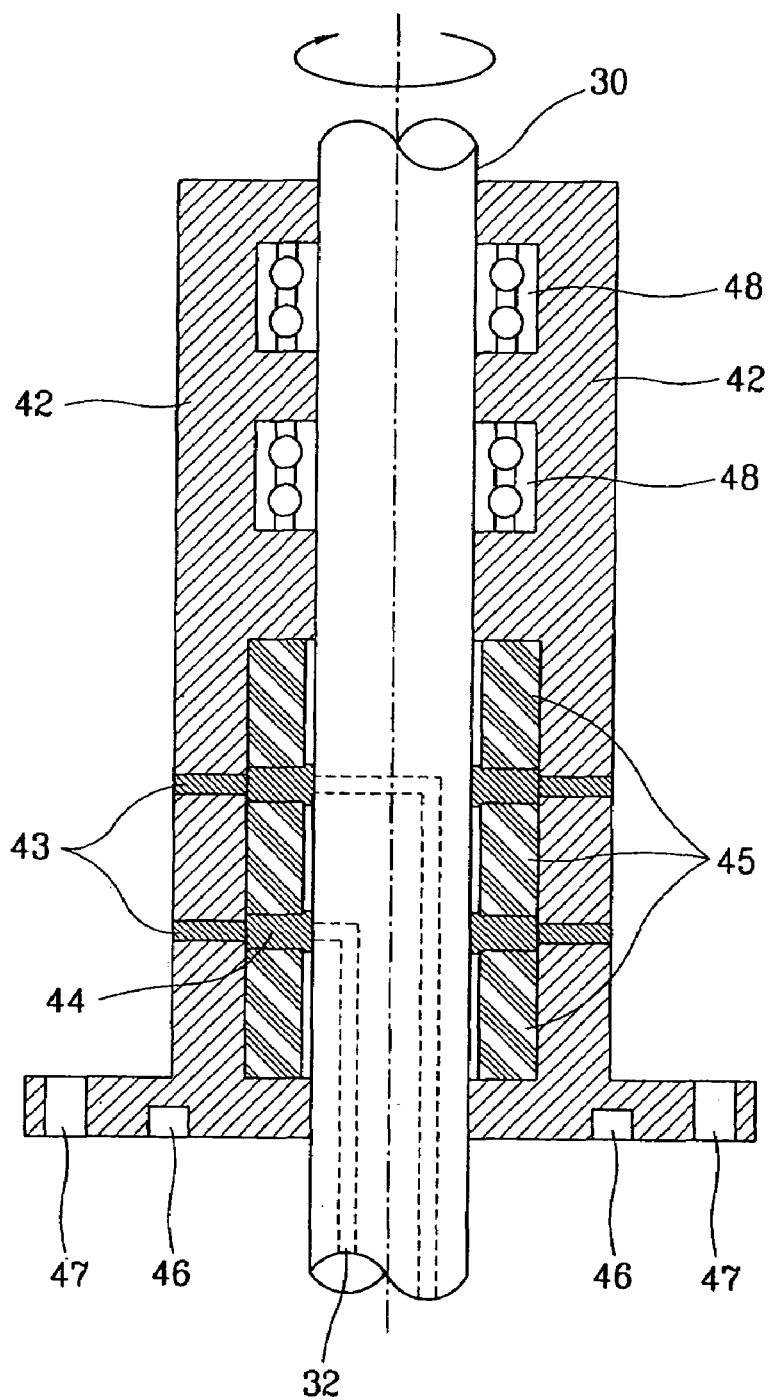
Figure 4:
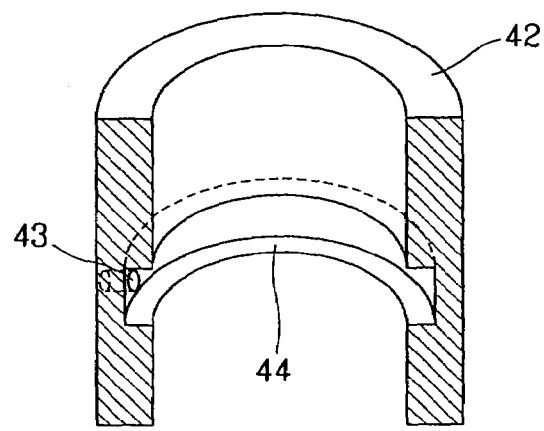
Figure 5:
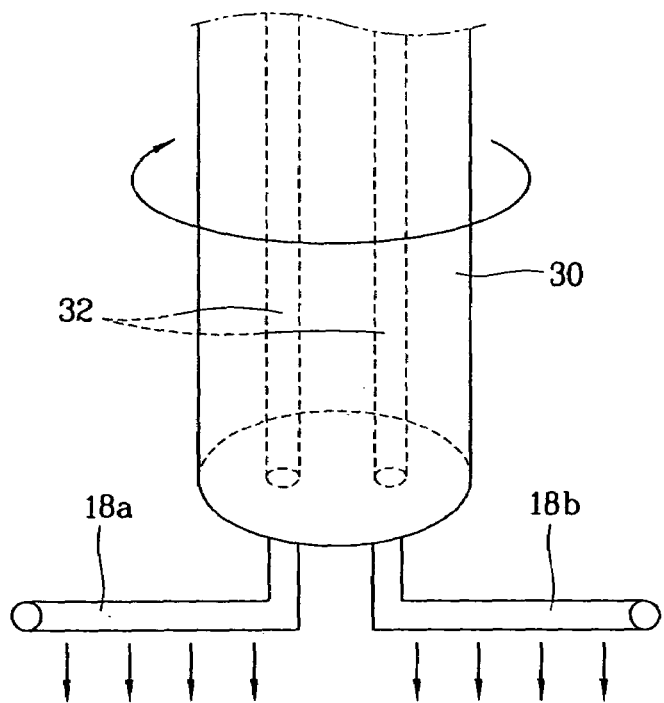

The rotation jet spray will be described in detail with reference to accompanying FIGS. 3~5. First, a cylinder 40 has an internal cylindrical space and is vertically flange-combined with the upper wall of the reaction chamber 10. In order to combine the cylinder 40 with the reaction chamber 10, a screw combining hole 47 is formed at the lower portion of the cylinder 40. In addition, the cylinder 40 includes an O-ring pipe 46 formed at a portion contacted tightly to the reaction chamber 10 in order to prevent leakage.

Two ring-shaped grooves 44 are formed along the circumference of the inner wall of the cylinder 40. In addition, two gas injection holes 43 are formed at the side wall of the cylinder 40 so as to penetrate the side wall and connect to the two ring-shaped grooves 44 respectively. FIG. 4 illustrates the connection in more detail.

The rotational shaft 30 is inserted into the cylinder 40 and is disposed in the reaction chamber 10. In order to control an insertion length of the rotational shaft 30, a position controller 26 is installed at the insertion portion.

Two gas supply pipes 32 are formed inside the rotational shaft 30 in the length direction. One end of each gas supply pipe 32 is connected to the ring-shaped groove. The rotational shaft 30 performs the rotation motion while tightly contacting to the cylinder 40, and a bearing 48 is installed at the internal wall of the cylinder 40 to make the rotational shaft 30 rotate more easily. In addition, the rotational shaft 30 and the cylinder 40 are tightly contacted with each other by a magnetic sealing 45. In order to lower frictional heat generated in the rotation of the rotational shaft 30, a water cooling pipe (not shown) can be additionally installed at the internal wall of the cylinder 40.

The spray injectors 18a, 18b have a tube shape, the gas supply pipes 32 are respectively connected to the insertion end of the rotational shaft 30, are horizontally installed and are horizontally rotated by the rotation motion of the rotational shaft 30. Plural injection holes 17 are formed at the lower portion of the spray injectors 18a, 18b.

When gas is injected through the two gas injection holes 43 respectively, the gas sequentially passes the ring-shaped groove 44 and the gas supply pipe 32 respectively and is injected into the reaction chamber 10 through the spray injectors 18a, 18b. Although the rotational shaft 30 rotates, because the two gas supply pipes 32 and the two ring-shaped grooves 44 are always in the connection state, gas supply is performed regardless of the rotation of the rotational shaft 30.

In the deposition of the SiOC thin film having low dielectric permitivity using the PECVD apparatus, the wafer 14 is mounted onto each susceptor 13, BTMSM and oxygen gas are supplied through the gas injection hole 43, hydrogen is supplied through the other gas injection hole 43, and the rotational shaft 30 is rotated at the speed of 1~100 RPM (round per minute).

The gas supplied to each gas injection hole 43 passes the pertinent ring-shaped groove 44, the gas supply pipe 32 and is injected into the reaction chamber 10 through the injection hole 17 of the spray injectors 18a, 18b. Because the gas is injected while the spray injectors 18a, 18b are rotated, the gas is evenly distributed inside the reaction space, and accordingly a thin film can be uniformly formed onto the plural wafers. In order to distribute gas more uniformly, it is preferable for the two spray injectors 18a, 18b to face each other centering around the center of the rotational shaft 30.

In order to make a chemical reaction on the surface of the wafer 14, the wafer 14 is heated at 25° C.~400° C., a pressure in the reaction chamber 10 is 0.1 Torr~1 Torr, RF power is applied in the range of 100 W~2000 W, and the thin film is formed onto the wafer 14. When plasma is formed, BTMSM is efficiently resolved, and accordingly the thin film fabrication reaction is accelerated.

Because BTMSM is supplied as a source of silicon and carbon, when BTMSM and oxygen are supplied, a SiOC thin film is fabricated. Herein, when hydrogen is supplied together, Si—C bonding is turned into Si—C—H bonding, and accordingly hydrogenated SiOC (H:SiOC) thin film is formed. As described above, when C—H bonding is performed by compounding carbon atom with hydrogen, it is possible to minimize the carbon loss although an oxygen ashing is performed as a following process. According to circumstances, first BTMSM vapor and oxygen gas are supplied to fabricate a SiOC thin film, afterward, the SiOC thin film surface is exposed to hydrogen plasma circumstances by supplying hydrogen into the thin film.

Figure 6:
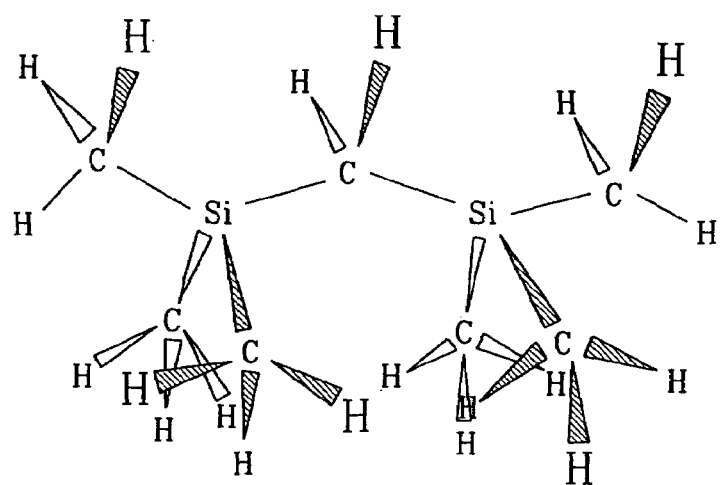
FIG. 6 illustrates a structure of BTMSM (bis-trimethylsilylmethane)

FIG. 6 illustrates a BTMSM structure. As depicted in FIG. 6, a molecular formula of BTMSM is $Si_2(CH_2)(C_3H_9)_2$, unlike deposition sources for the conventional SiOC thin film such as methylsilane, dimethylsilane, trimethylsilane and tetramethylsilane, there is carbon, namely, $CH_2$ between two silicon atoms. Because that carbon is commonly combined with the both silicon atoms, bonding force thereof is stronger than other carbon element ($CH_3$).

It means the bonding of silicon and carbon in BTMSM is stable, in comparison with the above-mentioned other sources, the SiOC thin film can retain larger carbon under the same processing condition. Accordingly, although a following semiconductor device fabrication process is performed after the thin film deposition, it is possible to secure stable SiOC thin film characteristics.

Another advantage of BTMSM is easy to handle. In more detail, because a boiling temperature of BTMSM is 132° C., a freezing temperature of BTMSM is −71° C., it is in a liquid state at room temperature, and it is non-combustible and avirulent. In addition, it has low air-sensitivity.

BTMSM stored in an automatic thermostatic bubbler maintains a certain vapor pressure. And, it is carried by carrier gas such as Ar, He, etc. and is supplied to the gas injection hole 43 with oxygen gas. The carrier gas is supplied at a flow rate of 50 sccm~500 sccm, and the oxygen gas is supplied at a flow rate of 50 sccm~1000 sccm. In the present invention, oxygen gas is used as oxidation reaction gas, and $O_3$, $N_2O$, $H_2O_2$, etc. can be used also.

FIGS. 7~10 are analysis graphs illustrating effects of the present invention.

Figure 7:
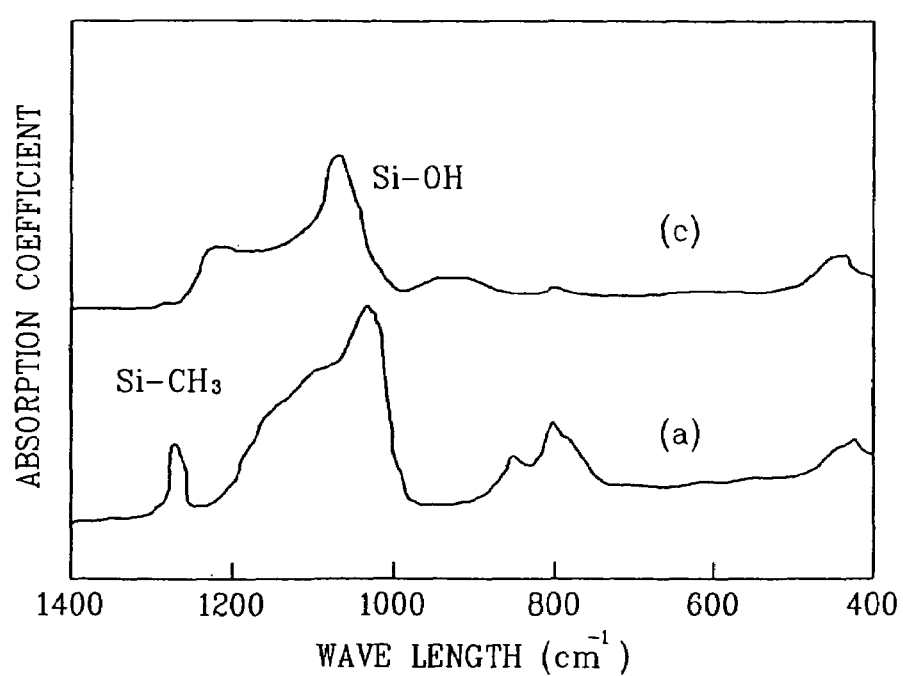
FIGS. 7~10 are analysis graphs illustrating effects of the present invention.

As depicted in FIG. 7, right after the SiOC thin film deposition there is Si—$CH_3$ bonding peak, after the oxygen ashing it does not exist, and the SiOC thin film has a $SiO_{2-X}H_X$ structure having a higher dielectric constant. When the oxygen ashing is performed after the SiOC thin film deposition without passing the hydrogen plasma processing, there is carbon desorption and loss.

Figure 8:
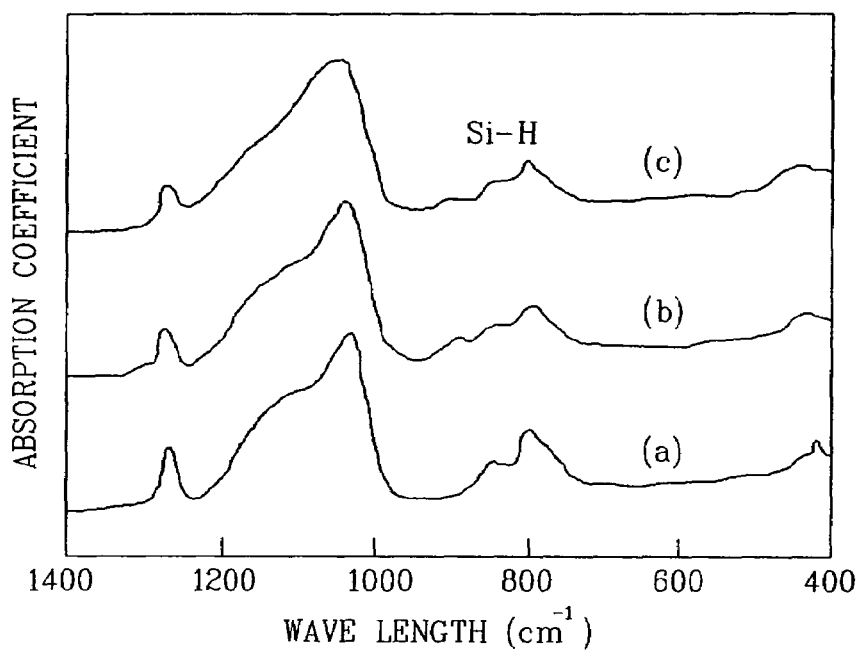
Figure 9:
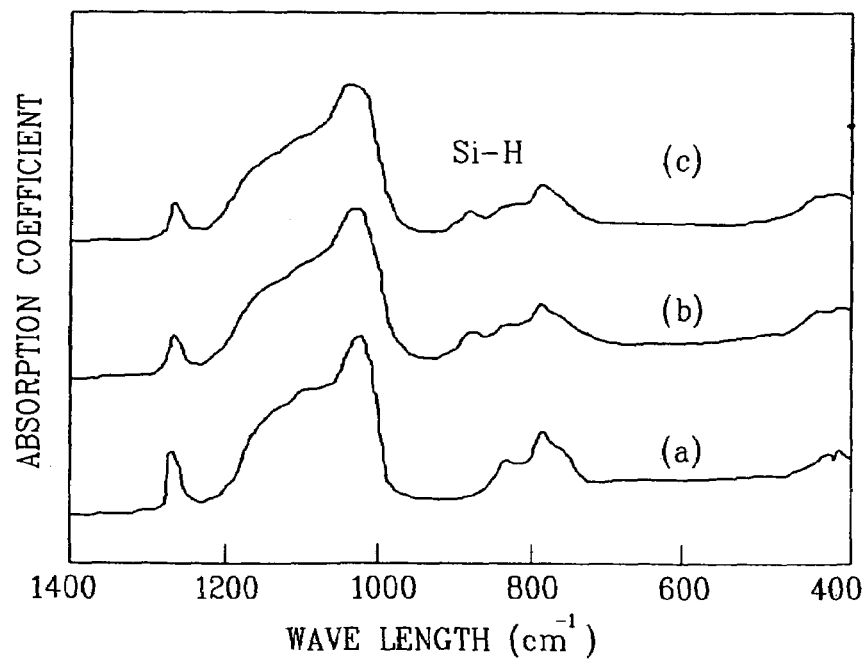
Figure 10:
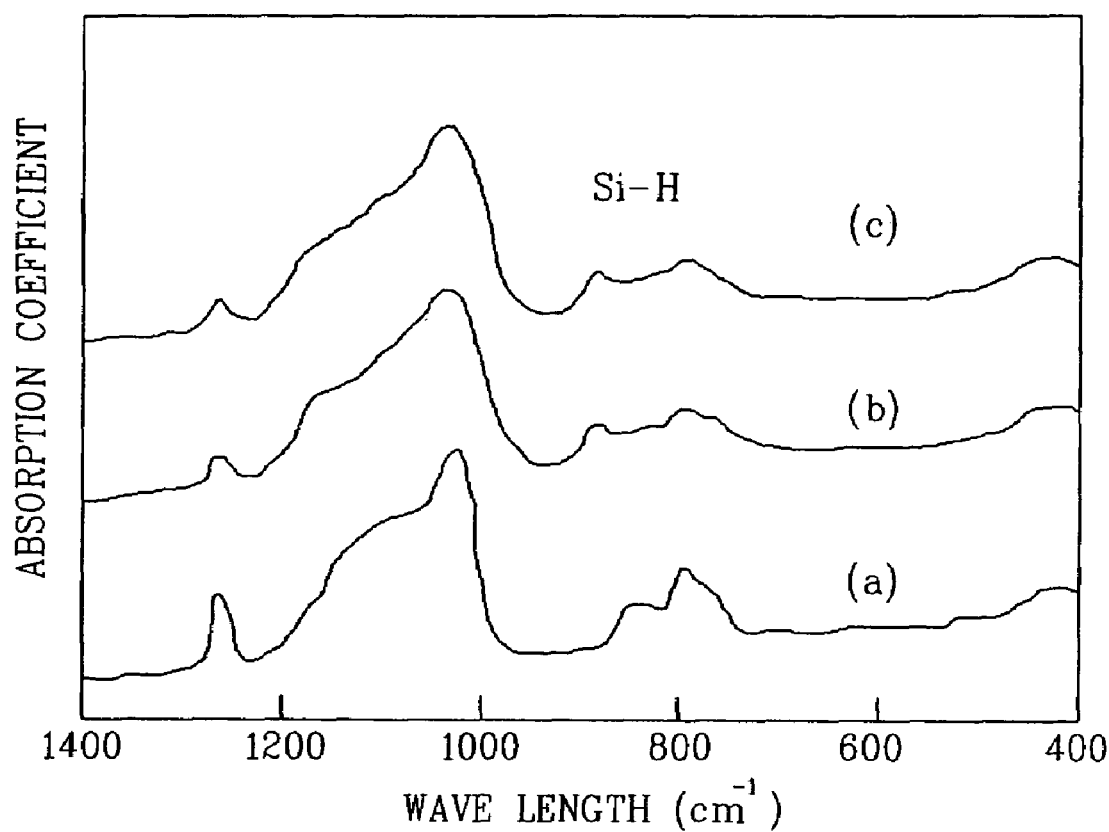

As depicted in FIGS. 8 and 9, not only right after the SiOC thin film deposition (a) but also after the hydrogen plsma processing (b) and the oxygen ashing (c), $S_1$—$CH_3$ bonding peak continually exists. It means carbon loss by the oxygen ashing is efficiently restrained by the hydrogen plasma processing. In FIG. 8, the hydrogen plasma processing (b) is performed for 5 minutes, in FIGS. 9 and 10, the hydrogen plasma processing (b) is performed for 10 minutes and 30 minutes respectively.

As described above, in the hydrogenated SiOC thin film fabrication method in accordance with the present invention, although a following process such as oxygen ashing, etc. is performed, it is possible to minimize carbon loss. And, because gases are injected in the rotation of spray injectors, even if there are several wafers, it is possible to form a hydrogenated SiOC thin film uniformly.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. In a PECVD (plasma enhanced chemical vapor deposition) apparatus including a reaction chamber, a gas supply unit, an exhaust unit, a power supply unit and a susceptor mounted with a wafer, a method for fabricating a hydrogenated SiOC (silicon oxycarbide) thin film comprises supplying BTMSM (bis-trimethylsilylmethane) and oxygen retaining gas onto a wafer installed inside a reaction channel through one supply pipe, simultaneously or sequentially supplying hydrogen onto the wafer through another supply pipe and generating plasma of those gases by applying RF power in the range of 100 W~2000 W in the supply.

2. The method of claim 1, wherein the supply pipe is rotated at the speed of 1~100 rpm.

3. The method of claim 1, wherein the wafer is heated at a temperature in the range of 25° C.~400° C. by a heater installed at the susceptor.

4. The method of claim 1, wherein a pressure in the reaction chamber is in the range of 0.1 Torr~1 Torr.

5. The method of claim 1, wherein the oxygen retaining gas is one of $O_2$, $O_3$, $N_2O$ and $H_2O_2$.

* * * * *